US009711613B2

(12) United States Patent
Franklin et al.

(10) Patent No.: US 9,711,613 B2
(45) Date of Patent: Jul. 18, 2017

(54) STACKED GRAPHENE FIELD-EFFECT TRANSISTOR

(71) Applicant: International Business Machines Corporation, Armonk, NY (US)

(72) Inventors: Aaron D. Franklin, Croton on Hudson, NY (US); Hiroyuki Miyazoe, White Plains, NY (US); Satoshi Oida, Yorktown Heights, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/342,168

(22) Filed: Nov. 3, 2016

(65) Prior Publication Data

US 2017/0077261 A1    Mar. 16, 2017

Related U.S. Application Data

(62) Division of application No. 14/591,988, filed on Jan. 8, 2015, now Pat. No. 9,508,801.

(51) Int. Cl.
*H01L 29/16*    (2006.01)
*H01L 29/66*    (2006.01)
(Continued)

(52) U.S. Cl.
CPC .. *H01L 29/66045* (2013.01); *H01L 21/02244* (2013.01); *H01L 21/02527* (2013.01); *H01L 21/042* (2013.01); *H01L 21/043* (2013.01); *H01L 21/044* (2013.01); *H01L 21/76805* (2013.01); *H01L 21/76877* (2013.01);
(Continued)

(58) Field of Classification Search
CPC ............. H01L 21/02527; H01L 21/042; H01L 21/043; H01L 21/044; H01L 29/1606; H01L 29/45; H01L 29/495; H01L 29/66045; H01L 29/778; H01L 29/78648; H01L 29/78684
USPC ........ 257/288, 368, 369; 438/151, 197, 199; 977/734, 742
See application file for complete search history.

(56) References Cited

U.S. PATENT DOCUMENTS

| 5,122,476 A | 6/1992 | Fazan et al. |
| 7,952,140 B2 | 5/2011 | Jang et al. |

(Continued)

FOREIGN PATENT DOCUMENTS

JP    2002217319 A    8/2002

OTHER PUBLICATIONS

Appenzeller, et al., "Band-to-Band Tunneling in Carbon Nanotube Field-Effect Transistors", Physical Review Letters, vol. 93, No. 19, week ending Nov. 5, 2004, © 2004, The American Physical Society.
(Continued)

*Primary Examiner* — Jarrett Stark
*Assistant Examiner* — Shahed Ahmed
(74) *Attorney, Agent, or Firm* — Daniel R. Simek (57) ABSTRACT

In an aspect of the present invention, a graphene field-effect transistor (GFET) structure is formed. The GFET structure comprises a wider portion and a narrow extension portion extending from the wider portion that includes one or more graphene layers edge contacted to source and drain contacts, wherein the source and drain contacts are self-aligned to the one or more graphene layers.

10 Claims, 7 Drawing Sheets

(51) Int. Cl.
 H01L 21/02 (2006.01)
 H01L 29/423 (2006.01)
 H01L 21/04 (2006.01)
 H01L 21/768 (2006.01)
 H01L 29/49 (2006.01)
 H01L 29/45 (2006.01)
 H01L 29/786 (2006.01)

(52) U.S. Cl.
 CPC .... *H01L 29/1606* (2013.01); *H01L 29/42392* (2013.01); *H01L 29/45* (2013.01); *H01L 29/4908* (2013.01); *H01L 29/78684* (2013.01)

(56) References Cited

U.S. PATENT DOCUMENTS

| 8,084,324 | B2 | 12/2011 | Sugimae et al. | |
|---|---|---|---|---|
| 8,541,829 | B2 | 9/2013 | Sugimae et al. | |
| 2011/0114919 | A1 | 5/2011 | Jenkins et al. | |
| 2012/0199815 | A1* | 8/2012 | Kondo | H01L 21/02381 257/29 |
| 2012/0248414 | A1* | 10/2012 | Kim | B82Y 10/00 257/29 |
| 2013/0082235 | A1 | 4/2013 | Gu et al. | |
| 2014/0103296 | A1* | 4/2014 | Yu | G01N 27/127 257/29 |

OTHER PUBLICATIONS

Badmaev, et al., "Self-Aligned Fabrication of Graphene RF Transistors with T-Shaped Gate", ACS NANO, vol. 6, No. 4, pp. 3371-3376, Published online Mar. 10, 2012, © 2012, American Chemical Society.
Franklin, et al., "Double Contacts for Improved Performance of Graphene Transistors", IEEE Electron Device Letters, vol. 33, No. 1, Jan. 2012, © 2011 IEEE.
Franklin, et al., "Stacking Graphene Channels in Parallel for Enhanced Performance With the Same Footprint", IEEE Electron Device Letters, vol. 34, No. 4, Apr. 2013, © 2013 IEEE.
IBM, Carbon Technology, "Self-Alighed Vertically Stacked Graphene FET: Device Structure", © 2012 IBM Corporation.
Kang, et al., "High mobility, low voltage polymer transistor", ScienceDirect, Organic Electronics 8 (2007), pp. 460-464, Available online Mar. 19, 2007, © 2007 Elsevier B.V.
Matsuda, et al., "Contact Resistance for "End-Contacted" Metal-Graphene and Metal-Nanotube Interfaces from Quantum Mechanics", J. Phys., Chem. C 2010, 114, pp. 17845-17850, Published on Web Sep. 23, 2010, © 2010 American Chemical Society.
Meric, et al., "Channel Length Scaling in Graphene Field-Effect Transistors Studied with Pulsed Current—Voltage Measurements", Nano Letters, ACS Publications, pp. 1093-1097, © 2011 American Chemical Society.
Smith, et al., "Reducing Contact Resistance in Graphene Devices through Contact Area Patterning", ACS NANO, vol. 7, No. 4, pp. 3661-3667, Published online Mar. 8, 2013, © 2013 American Chemical Society.
Wu, et al., "High-frequency, scaled graphene transistors on diamond-like carbon", Nature, vol. 472, Apr. 7, 2011, pp. 74-78, © 2011 Macmillan Publishers Limited.
Franklin, U.S. Appl. No. 14/591,988, filed Jan. 8, 2015.
List of IBM Patents or Patent Applications Treated as Related, Appendix P, Filed Herewith, 2 pages.

* cited by examiner

STACKED GRAPHENE FIELD-EFFECT TRANSISTOR

BACKGROUND OF THE INVENTION

The present invention relates generally to the field of semiconductor electronics, and more particularly to graphene field-effect transistors.

Field-effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the gate oxide. A voltage applied between the source and gate induces an electric field that modulates the conductivity of the channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field-effect transistors (MOSFETs) for logic functions.

Graphene is a single atomic layer of carbon that exhibits exceptional electronic properties, such as a relative high carrier mobility and saturation velocity. These exceptional properties enable graphene to be used to form graphene field-effect transistors (GFETs), which may be useful in applications up to the terahertz frequency region. A typical GFET includes a source contact and a drain contact with a graphene sheet extending between them to form a channel that is gated. The GFET operates, in part, by modulating the conductance of the graphene sheet, usually via a gate metal proximate the graphene sheet separated by a dielectric.

SUMMARY

One aspect of the present invention discloses a method for fabricating a graphene field-effect transistor (GFET) structure. The method comprises depositing a metal layer over a semiconductor substrate. The method further comprises depositing a first layer of gate dielectric onto the deposited metal layer. The method further comprises transferring a layer of graphene onto the first layer of gate dielectric. The method further comprises patterning the layer of graphene such that the patterned layer of graphene overlays a portion of the first layer of gate dielectric. The method further comprises depositing a second layer of gate dielectric onto the patterned layer of graphene such that the graphene layer is completely enclosed within dielectric material of the first and second dielectric layers to form an encapsulated graphene layer.

Another aspect of the present invention discloses a graphene field-effect transistor (GFET) structure. The GFET structure comprises a wider portion and a narrow extension portion extending from the wider portion that includes one or more graphene layers edge contacted to source and drain contacts, wherein the source and drain contacts are self-aligned to the one or more graphene layers. The wider portion of the GFET structure comprises a layer of metal overlaying the semiconductor substrate, a layer of gate dielectric overlaying the layer of metal, a top layer of metal overlaying a topmost layer of gate dielectric, and a layer of dielectric overlaying the top layer of metal, wherein outer surfaces of the metal layers are oxidized. The narrow extension portion comprises a layer of metal overlaying of the semiconductor substrate, a first layer of gate dielectric overlaying the layer of metal, a patterned layer of graphene overlaying a portion of the first layer of gate dielectric, a second layer of gate dielectric overlaying the patterned layer of graphene, a atop layer of metal overlaying a topmost layer of gate dielectric, a layer of dielectric overlying the top layer of metal, and a source contact and a drain contact self-aligned to the graphene layer, wherein the graphene layer is edge-contacted to the source and drain contacts, wherein outer surfaces of the metal layers are oxidized.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative and not restrictive. Further, the Figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on", "positioned on", or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating, or semiconductor layers at the interface of the two elements.

Some embodiments of the present invention recognize that graphene field-effect transistors (GFETs) are potentially useful in high-frequency radio frequency (RF) applications. The high carrier mobility and transconductance of GFETs enables delivery of remarkable performance up to the terahertz range. A challenge to GFETs is that many of the intrinsic benefits to graphene can be substantially compromised by the interfaces established during the fabrication process. The interfaces can give rise to non-idealities, such as high contact resistance and reduction in carrier mobility due to weak coupling of the contact metal to the graphene and process-induced scattering centers in the graphene channel, respectively. Additionally, exposed graphene sections in GFETs can lead to degradation of the graphene in these regions, introducing a series resistance that increases with processing, which, in turn, further negatively impacts the performance of the GFET.

Embodiments, in accordance with the present invention, generally provide a vertically-stacked GFET structure with contacts that are self-aligned to the gate stack that are capable of delivering high current and transconductance (e.g., for RF technologies) without increasing the footprint of the device. By stacking independent layers of graphene on top of each other, separated by a gate stack of insulator-metal-insulator, the current density and transconductance of a device are amplified linearly. In addition to the performance improvement made possible by each graphene layer in the transistor being modulated by a double-gate (metal gate on top and bottom), each graphene layer is also "edge-contacted" and the contacts are self-aligned to the gate stack, enabling improved contact resistance while eliminating gate underlap to boost performance and scaling capabilities. Furthermore, this method of performance enhancement is highly adaptable to the needs of a particular application wherein devices can be designed to include a certain number of vertically-stacked graphene layers to achieve a target performance level for a given device footprint. In another embodiment, the fabrication and manufacturing process allows of a reduction of the lithographic steps needed to complete each graphene layer within in the GFET structure, providing a strong potential yield improvement and minimization of process related degradation.

Figure 1:
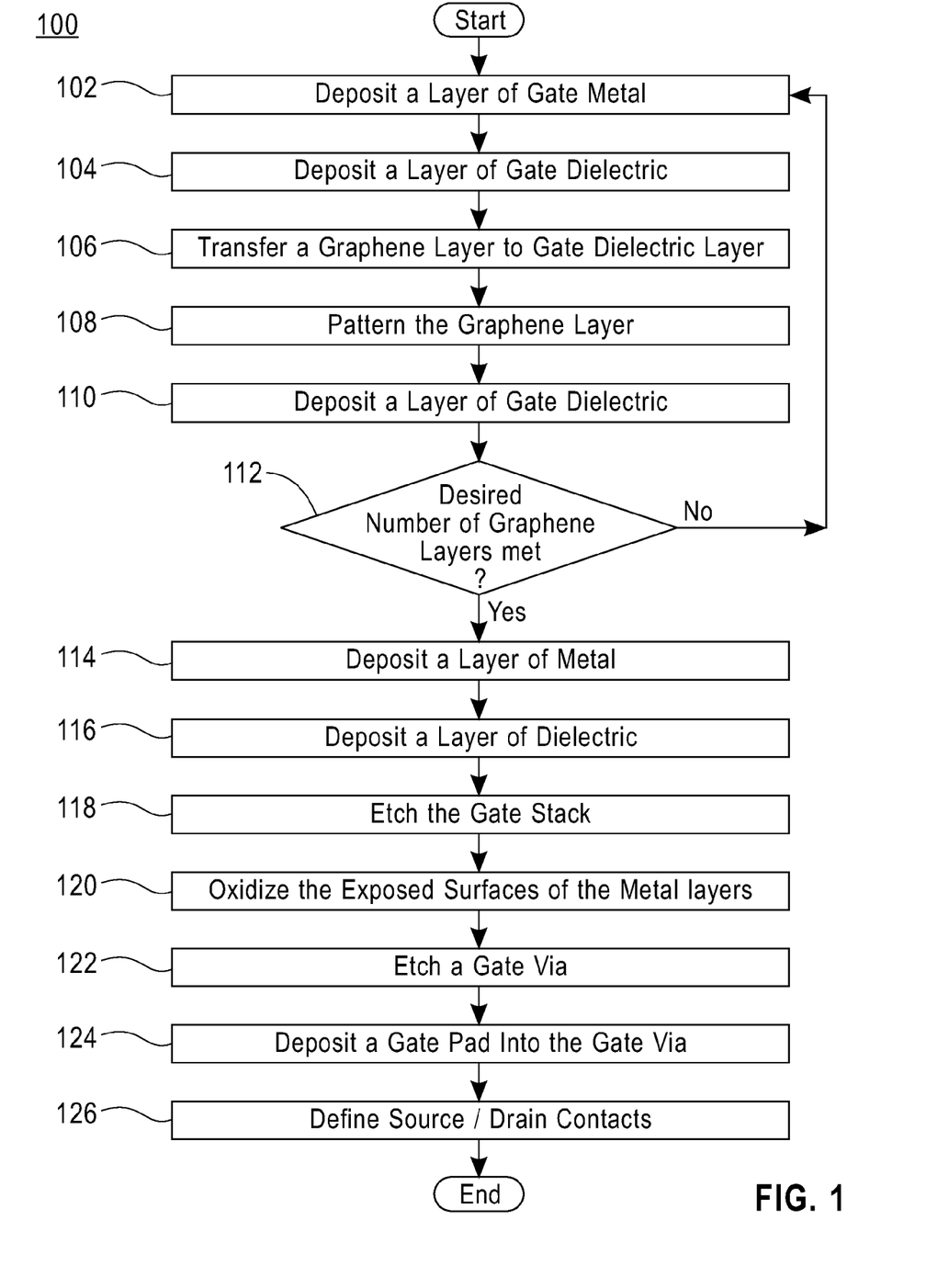
FIG. 1 depicts a flowchart illustrating an exemplary method of fabricating a graphene field-effect transistor, in accordance with embodiments of the present invention.

The present invention will now be described in detail with reference to the Figures. FIG. 1 is a flowchart illustrating, fabrication process 100, an exemplary method for fabricating a vertically-stacked GFET, in accordance with one embodiment of the present invention.

In step 102, fabrication process 100 deposits a layer of metal. In one embodiment, fabrication process 100 deposits a layer of Aluminum (Al) utilizing a deposition process (e.g., e-beam evaporation, a sputter deposition process, etc.) over a substrate. In additional embodiments, fabrication process 100 can deposit other types of metal and/or conductors, in accordance with embodiments of the present invention. In an example with regard to GFET 200 (depicted in FIG. 2A), fabrication process 100 deposits Al layer 202 onto substrate 201.

Figure 2A:
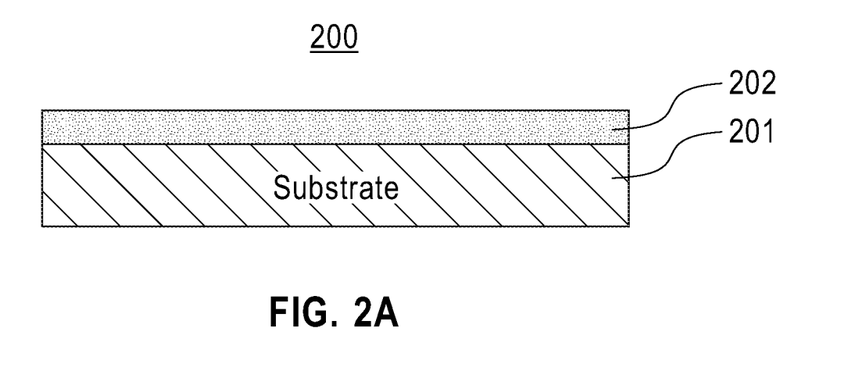
FIG. 2A depicts a cross-sectional view of a deposition of a layer of Aluminum on a substrate, in accordance with embodiments of the invention.

Substrate 201 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si, and combinations and multi-layers thereof. Substrate 201 may also be composed of other semiconductor materials, such as germanium, and compound semiconductor substrates, such as type III/V semiconductor substrates, e.g., GaAs. Although substrate 201 is depicted as a bulk semiconductor substrate, semiconductor on insulator (SOI) substrate arrangements, such as silicon on insulator substrates, are also suitable for substrate 201. In additional embodiments, substrate 201 contains a dielectric coating over the bulk semiconductor to isolate the source/drain/gate metals, keeping the source/drain/gate metals from shorting. The dielectric coating can be $SiO_2$ (thermal, plasma-enhanced chemical vapor deposition (PECVD), (low temperature oxide (LTO)), $Al_2O_3$ or $HfO_2$ (e.g. atomic layer deposition (ALD) deposited), $Si_3N_4$ (silicon nitride), etc. In another embodiment, substrate 201 is a sapphire substrate (e.g., $Al_2O_3$ bulk).

In step 104, fabrication process 100 deposits a layer of gate dielectric. In one embodiment, fabrication process 100 deposits a blanket layer of gate dielectric (e.g., $Al_2O_3$) onto the blanket layer of Al (deposited in step 102) utilizing atomic layer deposition (ALD). In an example with regard to GFET 210 (depicted in FIG. 2B), fabrication process 100 deposits gate dielectric layer 212 onto Al layer 202.

Figure 2B:
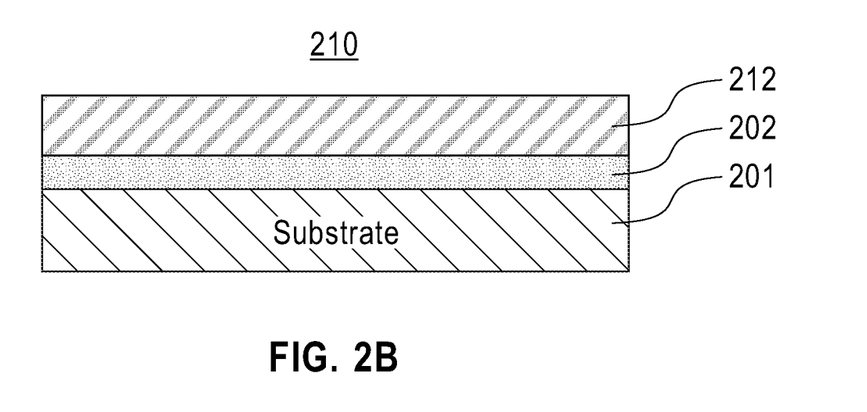
FIG. 2B depicts a cross-sectional view of a deposition of a layer of gate dielectric on the Aluminum layer of FIG. 2A, in accordance with embodiments of the invention.

Gate dielectric layer 212 may be a dielectric material, such as $SiO_2$, or alternatively a high-k dielectric, such as oxides of Hafnium (Hf), Tantalum (Ta), Zirconium (Zr), Al, or combinations thereof. In another embodiment, gate dielectric layer 212 is comprised of an oxide, such as $ZrO_2$, $Ta_2O_5$, or $Al_2O_3$.

In step 106, fabrication process 100 transfers a graphene layer to the gate dielectric layer. In one embodiment, fabrication process 100 transfers a layer of graphene onto the layer of gate dielectric (deposited in step 104). In various embodiments, fabrication process 100 can utilize a variety of graphene transfer processes known in the art, such as flexible substrate (e.g. thermal tape), polymer, or PET assisted transfer, the soak and peel method, hot pressing, engineered strain layer assisted transfer, direct delamination, layer by layer transfer (multilayer transfer technique), and micro cleaving graphene for transfer of patterned graphene. In an example with regard to GFET 220 (FIG. 2C), fabrication process 100 transfers graphene layer 222 onto gate dielectric layer 212. In various embodiments, fabrication process 100 transfers the graphene later onto the gate dielectric on the portion of the GFET that will be the mesa extension (discussed in further detail with regard to step 118). In an additional embodiment, fabrication process 100 transfers patterned graphene onto the layer of gate dielectric (deposited in step 104).

Figure 2C:
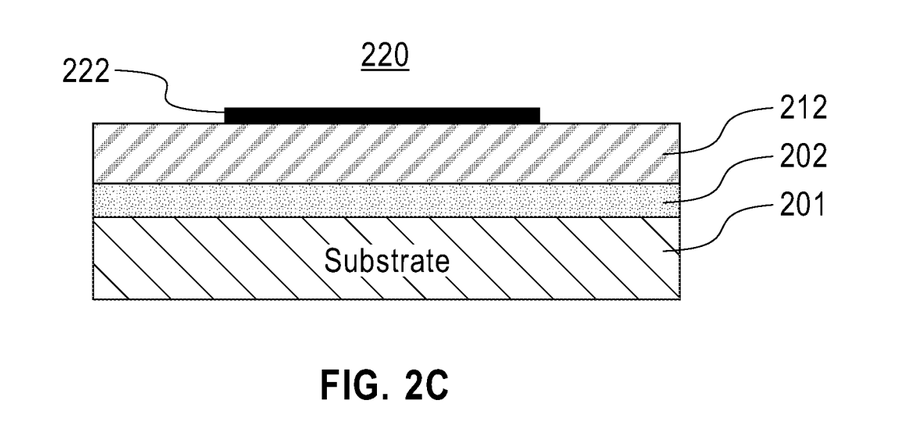
FIG. 2C depicts a cross-sectional view of a transfer of a layer of patterned graphene on the layer of gate dielectric of FIG. 2B, in accordance with embodiments of the invention.

In step 108, fabrication process 100 patterns the graphene layer. In one embodiment, fabrication process 100 patterns the graphene layer (transferred in step 106) utilizing lithographic techniques, such as electron beam lithography. In an example with regard to GFET 220, fabrication process 100 patterns graphene layer 222 (e.g., utilizing electron beam lithography), which fabrication process transferred onto gate dielectric layer 121 in step 106. In one embodiment, fabrication process 100 patterns graphene layer 222 such that graphene layer 222 is only present in the regions that will define the channel if the field-effect transistor (FET) structure (i.e., graphene layer 222) covers only a small portion of the dielectric layer 212 (as depicted in FIG. 2C). In various embodiments, patterning is the shaping or altering of deposited materials using lithographic techniques. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist can be removed by a solvent cleaning process. In another example, fabrication process 100 utilizes negative lithography. In negative lithography, the exposed resist remains during development, and the unexposed resist everywhere else is washed away. Negative lithography is useful for masking the small regions that will become channels for the graphene FET structure. Fabrication process 100 utilizes a light $O_2$ plasma to etch away the exposed graphene everywhere else, and a solvent clean in acetone/isopropyl alcohol removes the resist.

In step 110, fabrication process 100 deposits a layer of gate dielectric. In one embodiment, fabrication process 100, utilizing ALD, deposits a layer of gate dielectric (e.g., $Al_2O_3$) onto the layer of graphene (transferred in step 106 and patterned in step 108) and the layer of gate dielectric (deposited in step 104), since the patterned layer of graphene does not completely cover the layer of gate dielectric. In an example with regard to GFET 225 (FIG. 2D), fabrication process 100 deposits a blanket layer of gate dielectric onto graphene layer 222, forming gate dielectric layer 212, which completely encloses graphene layer 222. In this example, since graphene layer 222 does not completely cover gate dielectric later 212 (deposited in step 106), fabrication process 100 deposits an additional gate dielectric layer onto graphene layer 222, and the portions of gate dielectric layer 212 not covered by graphene layer 222, completing formation of gate dielectric layer 212.

Figure 2D:
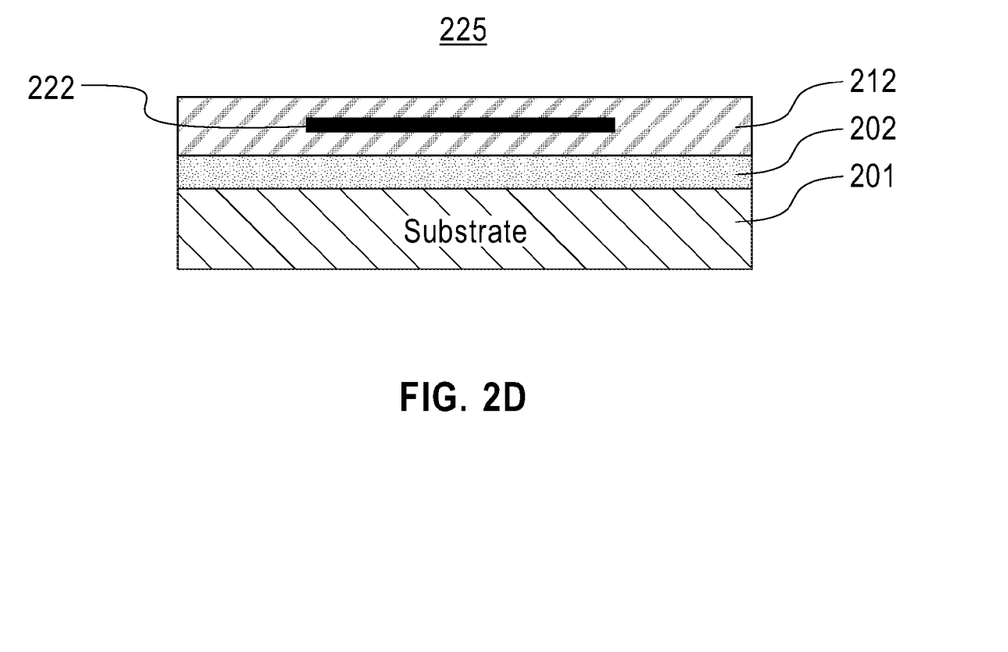
FIG. 2D depicts a cross-sectional view of a deposition of a layer of gate dielectric on the layer of graphene of FIG. 2D, in accordance with embodiments of the invention.

In one embodiment, graphene layer 222 may further include a seed layer for the attachment or adhesion of a dielectric layer. For example, the seed layer, or nucleation layer, may comprise thermally or electron beam (e-beam) evaporated titanium (Ti) or Al for the attachment of a dielectric layer. In an example embodiment, the titanium or aluminum is oxidized (e.g., $TiO_x$, $Al_2O_3$). In another example embodiment, the seed layer has a thickness of approximately six to twelve angstroms. In another embodiment, the seed layer is formed by ALD and may comprise aluminum oxynitride ($AlO_xN_y$) or nitrous oxide ($NO_2$). In an additional embodiment, the ALD-formed seed layer is approximately one to two nanometers thick. In one embodiment, a temperature anneal is performed on the seed layer (e.g., at or above 300 degrees Celsius) prior to deposition of the dielectric layer. Notably, a variety of materials adhere poorly to graphene. Thus, the presence of a seed layer facilitates the use of a greater variety of materials in dielectric layer than would otherwise be possible.

Figure 2E:
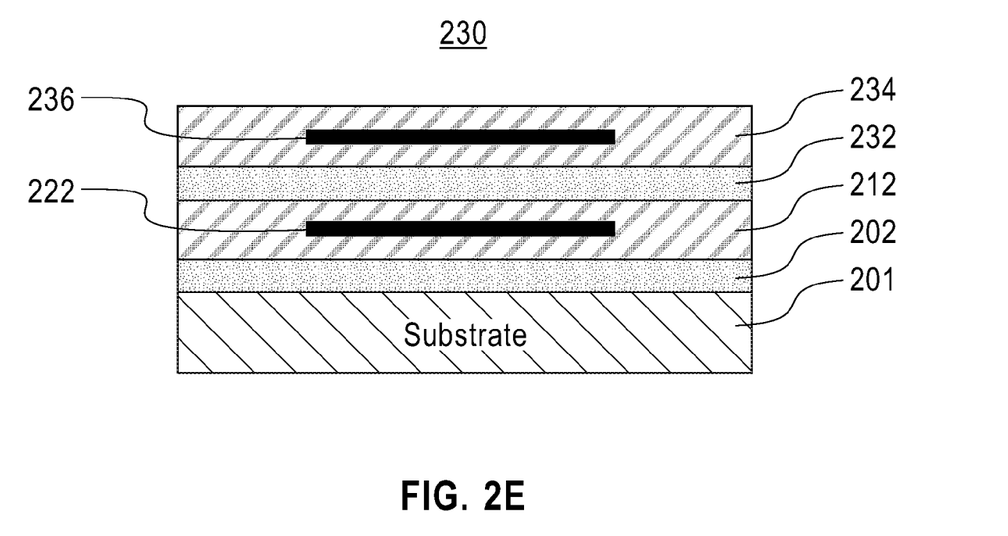
FIG. 2E depicts a cross-sectional view of a graphene field-effect transistor (GFET) structure that includes two graphene layers, in accordance with embodiments of the invention.

In decision step 112, fabrication process 100 repeats steps 102 through 110 until the desired number of graphene layers have been incorporated into the GFET stack. In one embodiment, fabrication process 100 operates to fabricate a GFET with a previously specified number of graphene layers. In an example embodiment, fabrication process 100 operates to fabricate a GFET that includes two graphene layers, which is depicted as GFET 230 in FIG. 2E. In response to the GFET not including the previously specified number of graphene layers (decision step 112, "no" branch), fabrication process 100 returns to step 102.

In step 114, fabrication process 100 deposits a layer of metal. In one embodiment, in response to the GFET stack including the desired number of graphene (decision step 112, "yes" branch), fabrication process 100 deposits a layer of Al utilizing a deposition process (e.g., e-beam evaporation, a sputter deposition process, etc.) onto the top layer (i.e., uppermost layer) of gate dielectric (deposited in step 110). In additional embodiments, fabrication process 100 can deposit other types of metal and/or conductors, in accordance with embodiments of the present invention.

Figure 2F:
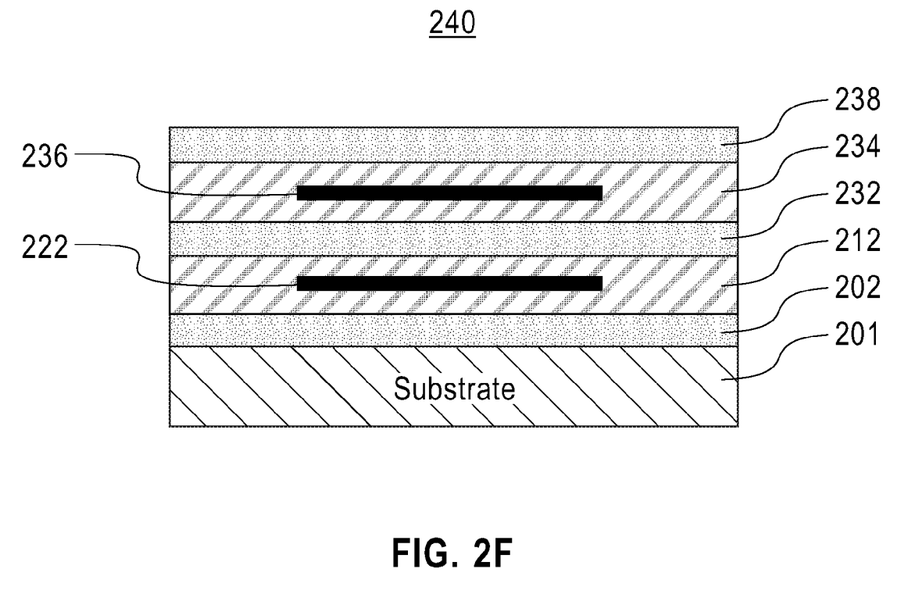
FIG. 2F depicts a cross-sectional view of a deposition of a layer of Aluminum on a graphene field-effect transistor (GFET) structure that includes two graphene layers, in accordance with embodiments of the invention.

In an example with regard to GFET 240 (FIG. 2F), the GFET includes the desired two graphene layers (i.e., graphene layers 222 and 236 in GFET 240), and fabrication process 100 deposits Al layer 238 onto gate dielectric layer 234. In this example, fabrication process 100 repeats steps 102-110 to deposit Al layer 232 (step 102), gate dielectric layer 234 (step 104 and step 110), and graphene layer 236 (steps 106 and step 108), which fabricates a GFET with two layers of graphene (i.e., GFET 240). In an example embodiment, fabrication process transfers and patterns graphene layer 236 on the GFET in a substantially similar location to graphene layer 222.

Figure 2G:
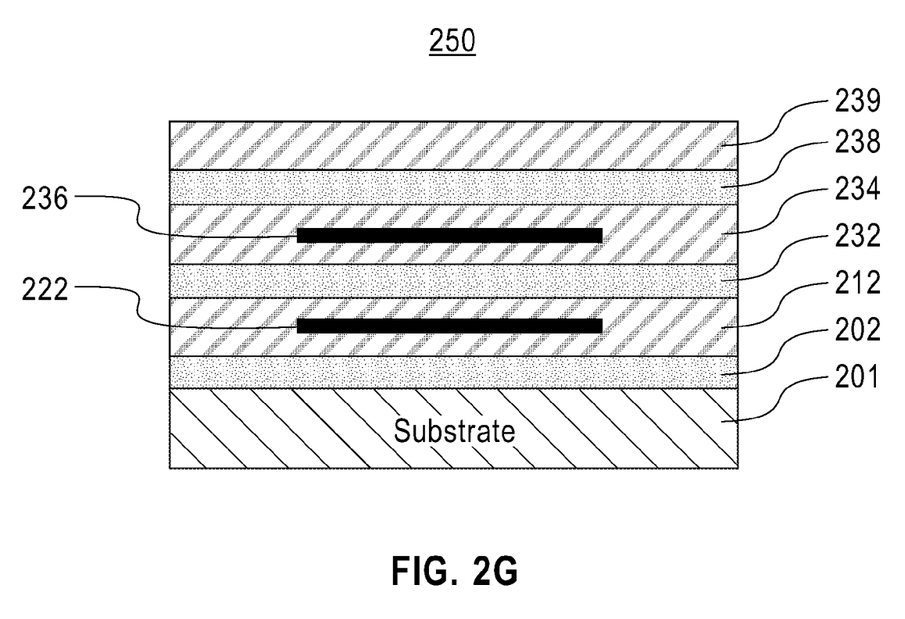
FIG. 2G depicts a cross-sectional view of a deposition of a layer of gate dielectric on the layer of Aluminum of FIG. 2F, in accordance with embodiments of the invention.

In step 116, fabrication process 100 deposits a layer of dielectric. In one embodiment, fabrication process 100 deposits a layer of dielectric onto the layer of Al (deposited in step 114). In various embodiments, fabrication process 100 deposits a dielectric layer that is thicker than the gate dielectric layer deposited in step 104 to help ensure that gate leakage is not induced between source/drain contacts and the top gate metal layer. In an example with regard to GFET 250 (FIG. 2G), fabrication process 100 deposits dielectric layer 239 onto Al layer 238.

In step 118, fabrication process 100 etches the stack. In one embodiment, fabrication process 100 etches the GFET stack (e.g., GFET 250) to define a T-shaped mesa structure with a narrow mesa extension portion comprising the stack containing the patterned graphene layers (i.e., graphene layers 222 and 236) that will define the GFET channels. In an example embodiment, fabrication process 100 etches the multi-layer stack utilizing a chlorine-based reactive-ion etching (RIE) chemistry. In another example embodiment, fabrication process 100 etches the multi-layer stack utilizing Argon (Ar) milling using a Palladium (Pd) etch barrier to mask the underlying layers. Fabrication process 100 can utilize a sacrificial masking layer beneath the Pd etch barrier to selectively remove the Pd after defining the mesa. In an example, fabrication process 100 etches the GFET stack (e.g., GFET 250) to define GFET structure 300 (depicted in FIG. 3). GFET structure 300 includes mesa structure 310 and mesa extension 315, which extends from mesa structure 310 coplanar to substrate 201. Mesa extension 315 includes the portion of GFET 250 that includes graphene layers 222 and 236 (transferred and patterned in steps 106 and 108). The side walls of GFET structure 300 are semi-vertical, slanting inward toward the top of the stack. Graphene layers 222 and 236 in mesa extension of GFET structure 300 are accessible and exposed on the two side walls of GFET structure opposite each other and are capable of being contacted at a later step (i.e., step 126).

Figure 3:
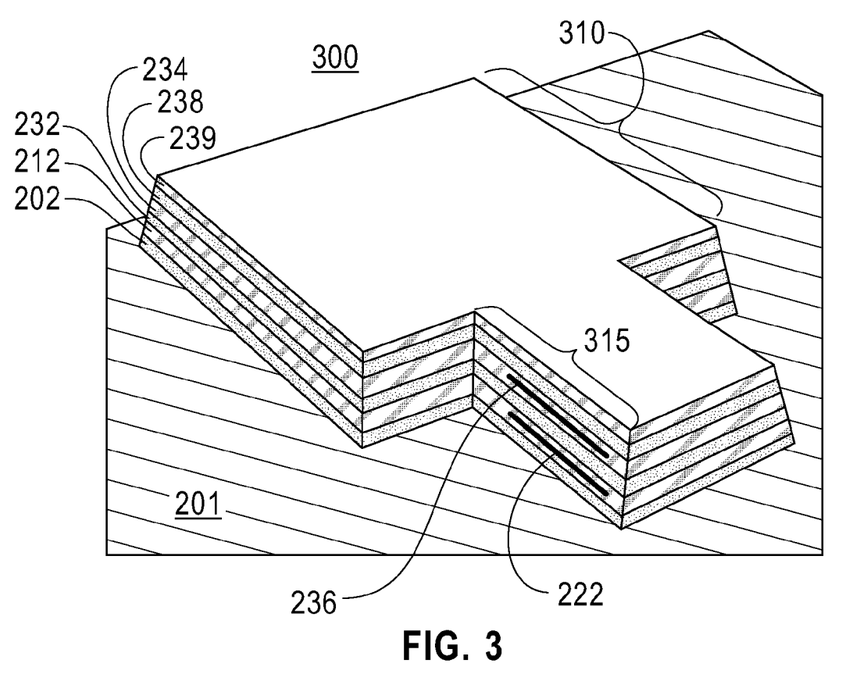
FIG. 3 depicts a perspective view of an etched GFET multi-gate stack (of FIG. 2G), in accordance with embodiments of the invention.
Figure 4:
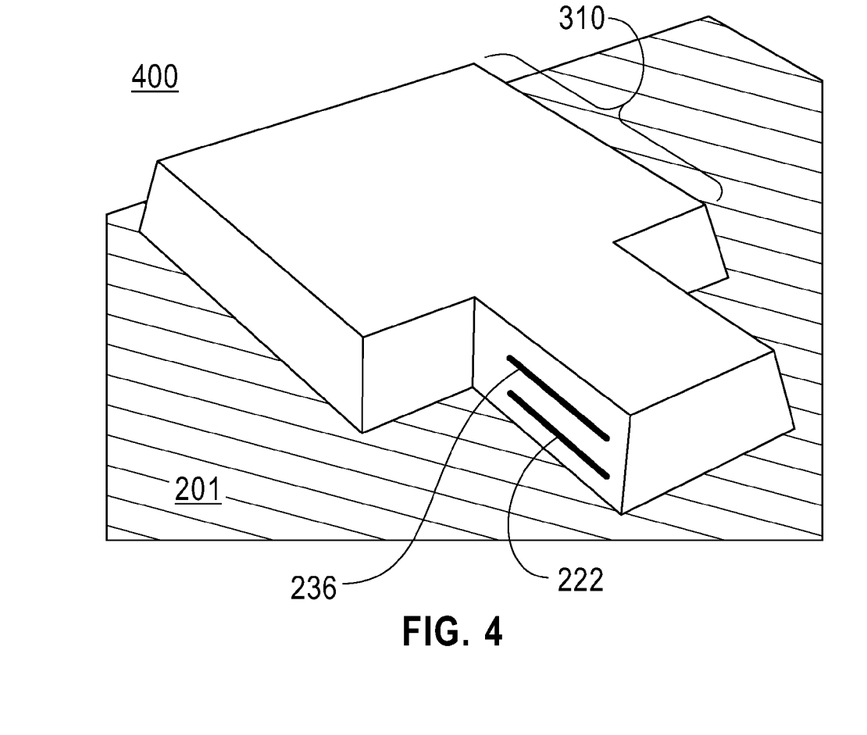
FIG. 4 depicts a perspective view of an oxidation of the exposed metal surfaces of the etched GFET structure of FIG. 3, in accordance with embodiments of the invention.

In step 120, fabrication process 100 oxides the exposed surfaces of the metal layers. In one embodiment, fabrication process 100 oxidizes the Al that is exposed on the side walls of GFET structure 300 (e.g., in Al layers 202, 232, and 238). In an example embodiment, fabrication process 100 utilizes a lower temperature oxidation in a water-rich environment, RIE induced $Al_2O_3$ formation, and/or an anodization process. For example, fabrication process 100 oxidizes the exposed Al to prevent a short between source/drain contact and gate layers. In an example, fabrication process 100 oxidizes the exposed Al on the side walls of GFET structure 300 to create GFET structure 400. GFET structure 400 does not have exposed Al layers (e.g., like Al layers 202, 232, and 238 in GFET structure 300), but the edges of graphene layers 222 and 236 remain exposed or can be accessed with a short dilute hydrofluoric acid etch if $Al_2O_3$ formation at the surface of the Al layers are made thicker causing expansion of the $Al_2O_3$ outward (discussed in further detail in step 126).

Figure 5:
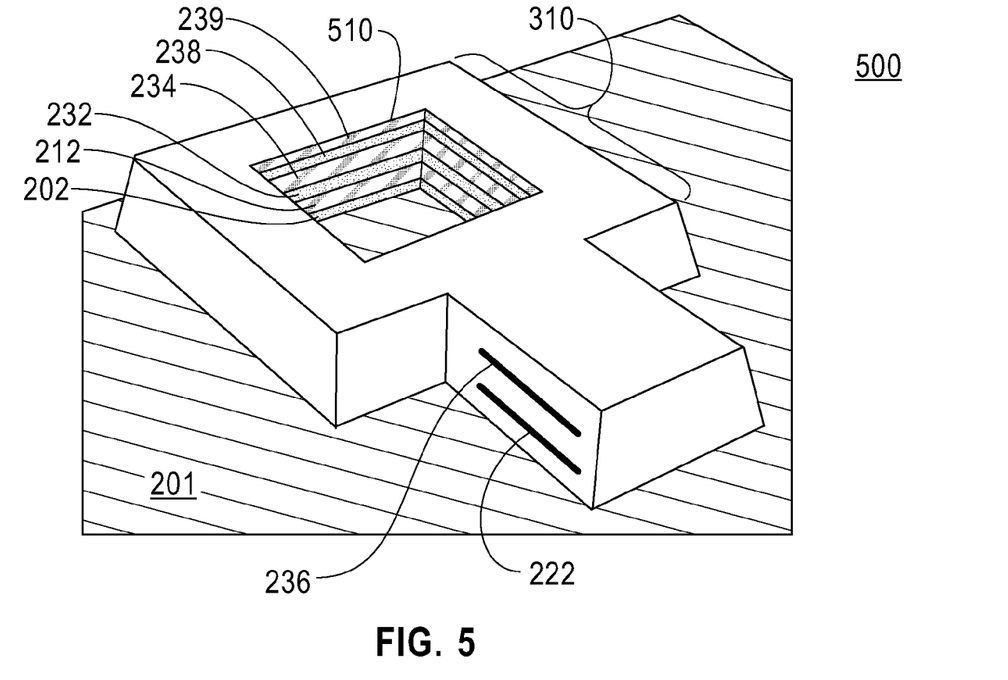
FIG. 5 depicts a perspective view of a gate via etched into the GFET structure of FIG. 4, in accordance with embodiments of the invention.

In step 122, fabrication process 100 etches a gate via. In one embodiment, fabrication process 100 etches a gate via into the mesa structure of GFET structure 400. In various embodiments, fabrication process 100 etches the GFET utilizing a chlorine-based reactive-ion etching (RIE) chemistry, Ar milling using a Pd etch barrier, or other forms of etching techniques. In an example, fabrication process 100 etches a gate via into mesa structure 310 of GFET structure 400 to create gate via 510 in mesa structure 310 of GFET structure 500 (depicted in FIG. 5). In this example, gate via 510 extends from the top of mesa structure 310 (i.e., dielectric layer 239) down through Al layer 202 exposing substrate 201 to be the floor of the gate via.

Figure 6:
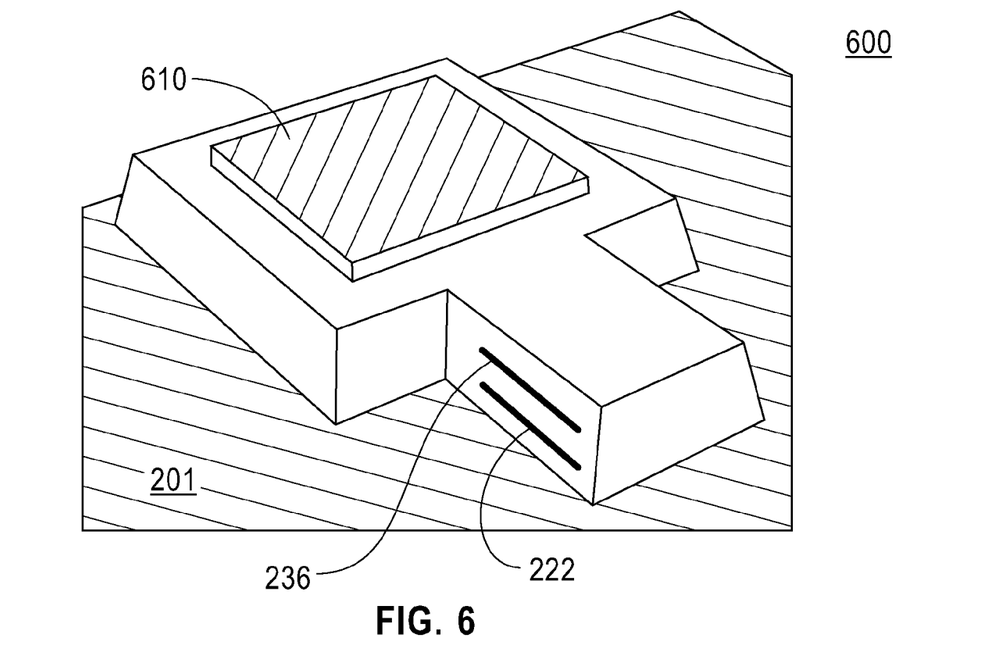
FIG. 6 depicts a perspective view of a deposition of a gate metal into the gate via of the GFET structure of FIG. 5 to form a gate pad, in accordance with embodiments of the invention.

In step 124, fabrication process 100 deposits a gate pad into the gate via. In one embodiment, fabrication process 100 deposits a gate metal plug into the gate via (etched in step 122) to electrically connect the individual gate layers (e.g., Al layers 202, 232, and 238). In various embodiments, fabrication process 100 can utilize a brief Ar sputter process prior to metallization to ensure removal of additional native $Al_2O_3$ that formed on the Al gate layers (similar to standard via processing). In an example with regard to GFET structure 600 (FIG. 6), fabrication process 100 deposits gate pad 610 filling the gate via (etched in step 122 and depicted in FIG. 5 as gate via 510).

In step 126, fabrication process defines the source/drain contacts. In one embodiment, fabrication process 100 defines source/drain metal contacts self-aligned to the graphene layers of the GFET (transferred and patterned in steps 106 and 108) utilizing lithography, evaporation, and liftoff processes. The edges of the graphene layers define where fabrication process 100 defines where the source/drain contacts will be aligned to. In an example embodiment, fabrication process 100 employs a short dip in dilute buffered hydrofluoric acid prior to defining the source/drain contacts to further ensure contact to the graphene layers, opening lithographic windows on the sides of the mesa extension to etch back the side wall dielectric up to a few nanometers, further exposing the edges of the graphene layers just prior to metal deposition and liftoff using the same lithographic windows. In another embodiment, fabrication process 100 masks off portions the GFET that do not include the graphene layers, which allows fabrication process 100 to deposit the source and drain contacts self-aligned to the exposed edges of graphene. In an additional embodiment, fabrication process 100 employs a post-fabrication anneal to significantly improve contact resistance. For example, fabrication process 100 performs a thermal anneal subsequent to creation of the source/drain contacts.

Figure 7:
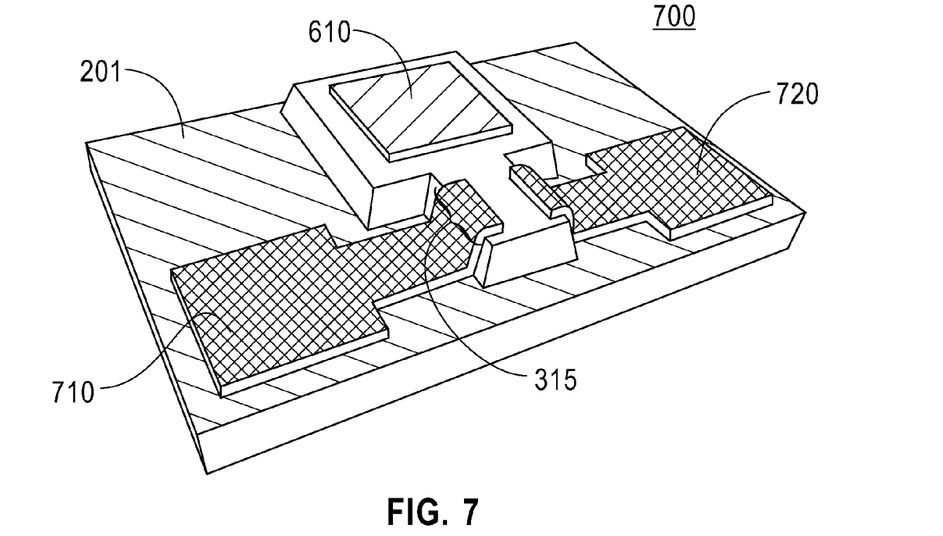
FIG. 7 depicts a perspective view of source and drain contacts defined the GFET structure of FIG. 6, in accordance with embodiments of the invention.

In an example with regard to GFET structure 700 (depicted in FIG. 7), fabrication process 100 defines source contact 710 and drain contact 720 onto substrate 201 connected to the sides of mesa extension 315. The exposed edges of graphene layers 222 and 236 (depicted in FIG. 6) define the location on mesa extension where fabrication process 100 defines source contact 710 and drain contact 720 (i.e., source contact 710 and drain contact 720 are self-aligned to graphene layers 222 and 236). In one example, source contact 710 and drain contact 720 are Chromium (Cr) metal contacts. In another example, fabrication process 100 defines source contact 710 and drain contact 720 utilizing an adhesion layer of Cr. In additional embodiments, another metal is on top of the Cr (e.g., Pd, Pd/Au, etc.), which can prevent the Cr from oxidizing and decrease the resistivity of the contact metal.

Figure 8:
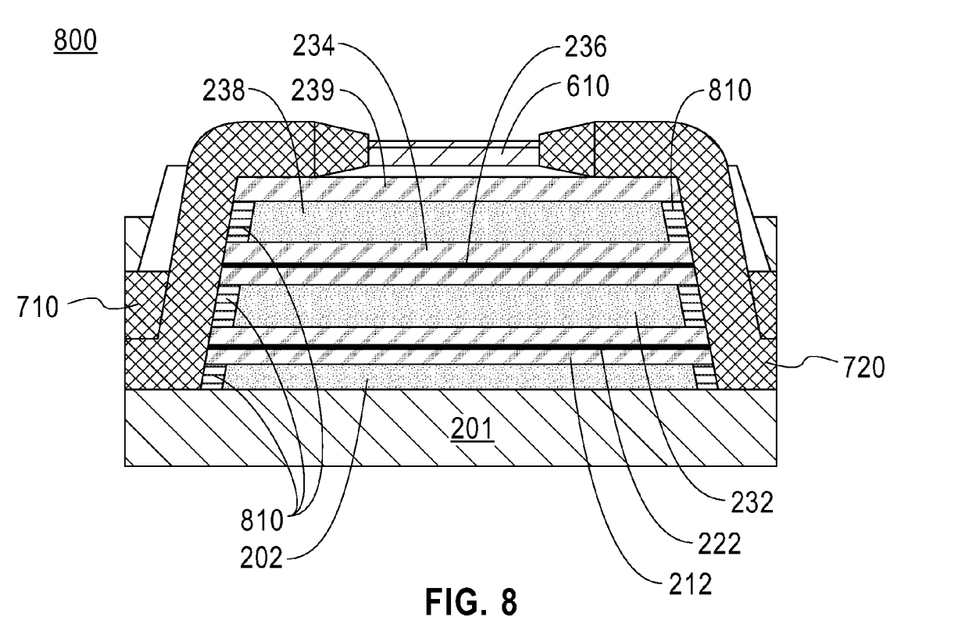
FIG. 8 depicts a cross-sectional view of the GFET structure of FIG. 7, in accordance with embodiments of the invention.

FIG. 8 depicts a cross-sectional view of GFET structure 800, which is an example cross-sectional view of the mesa extension area of a GFET structure fabricated via fabrication process 100, in accordance with embodiments of the present invention. GFET structure 800 is an example GFET fabricated via fabrication process 100 that includes two layers of graphene (i.e., graphene layers 222 and 236). GFET structure 800 includes Al layer 202 (deposited on substrate 201 in step 102), and gate dielectric layer 212 (deposited onto Al layer 202 in steps 104 and 110), which includes graphene layer 222 (transferred onto gate dielectric 212 in step 106 and patterned in step 108). Since GFET structure 800 was intended to include two graphene layers, in decision step 112 "no" branch" fabrication process 100 determined that an additional graphene layer was necessary and continued fabricating GFET structure 800 to add the second layer of graphene. GFET structure 800 includes Al layer 232 (deposited on gate dielectric layer 212 in step 102) and gate dielectric layer 234 (deposited onto Al layer 232 in steps 104 and 110), which includes graphene layer 236 (transferred onto gate dielectric layer 234 in step 106 and patterned in step 108). In response to verifying that GFET structure 800 includes the desired two layers of graphene (i.e., graphene layers 222 and 236), fabrication process 100 determined that no additional graphene layers were necessary and continued fabricating GFET structure 800 (decision step 112, "yes" branch). GFET structure 800 includes Al layer 238 (deposited onto gate dielectric layer 234 in step 114) and gate dielectric layer 238 (deposited onto Al layer 238 in step 116).

GFET structure 800 includes oxidized Al sections 810, which were the exposed portions of Al layers 202, 232, and 238 on the side wall of GFET structure 800 (oxidized in step 120). GFET structure 800 includes gate pad 610, which fabrication process 100 deposited (in step 124) into a gate via (etched in step 122 and depicted as gate via 510 in FIG. 5). GFET structure 800 includes source contact 710 and drain contact 720, which fabrication process 100 defined in step 126. Source contact 710 and drain contact 720 are self-aligned to graphene layers 222 and 236. As depicted in FIG. 8, source contact 710 and drain contact 720 form an "end-contact" connection with the ends of graphene layers 222 and 236.

What is claimed is:

1. A method for fabricating a graphene field-effect transistor (GFET) structure, the method comprising:
    depositing a metal layer over a semiconductor substrate;
    depositing a first layer of gate dielectric onto the deposited metal layer;
    transferring a layer of graphene onto the first layer of gate dielectric;
    patterning the layer of graphene such that the patterned layer of graphene overlays a portion of the first layer of gate dielectric; and
    depositing a second layer of gate dielectric onto the patterned layer of graphene such that the graphene layer is completely enclosed within dielectric material of the first and second dielectric layers to form an encapsulated graphene layer.

2. The method of claim 1, further comprising:
    for a specified number of additional graphene layers, performing, for each additional graphene layer, the following steps:
    depositing another metal layer over a previously formed encapsulated graphene layer;
    depositing another first layer of gate dielectric onto the other metal layer;
    transferring another graphene layer onto the other first layer of gate dielectric;
    patterning the other layer of graphene such that the patterned other layer of graphene overlays a portion of the first other layer of gate dielectric; and
    depositing another second layer of gate dielectric onto the other patterned layer of graphene such that the other graphene layer is completely enclosed within dielectric material of the other first and other second dielectric layers to form another encapsulated graphene layer.

3. The method of claim 1, further comprising:
    depositing a top metal layer on an uppermost encapsulated graphene layer; and
    depositing a dielectric layer over the top metal layer, wherein the dielectric layer is thicker than previously deposited layers of gate dielectric;
    wherein the resulting one or more metal layers, one or more encapsulated graphene layers, the top metal layer, and the dielectric layer, form a GFET stack.

4. The method of claim 3, further comprising:
    etching the GFET stack to define an etched GFET stack that includes a wider portion and a narrow extension portion extending coplanar to the semiconductor substrate,
    wherein the wider portion does not include any patterned graphene layers; and
    wherein the narrow extension portion includes one or more patterned graphene layers, and the etching exposes edge portions of the encapsulated graphene layers.

5. The method of claim 4, further comprising:
    oxidizing exposed surfaces of all metal layers in the etched GFET stack.

6. The method of claim 5, further comprising:
    etching a through hole into the wider portion of the etched GFET stack to form a via; and
    depositing a gate metal plug into the via.

7. The method of claim 6, further comprising:
    defining source and drain contacts onto the narrow extension portion of the etched GFET self-aligned to the exposed edge portions of the one or more graphene layers.

8. The method of claim 1, wherein the metal layer comprises Aluminum.

9. The method of claim 7, wherein the source and drain contacts comprise Chromium.

10. The method of claim 7, further comprising:
    performing a thermal anneal subsequent to creation of the source and drain contacts.

* * * * *